United States Patent [19]

Demaray et al.

[11] Patent Number: 4,834,860

[45] Date of Patent: May 30, 1989

[54] MAGNETRON SPUTTERING TARGETS

[75] Inventors: Richard E. Demaray, Hercules; Gary B. Crumley, Oakland, both of Calif.

[73] Assignee: The BOC Group, Inc., Montvale, N.J.

[21] Appl. No.: 68,869

[22] Filed: Jul. 1, 1987

[51] Int. Cl.⁴ .............................................. C23C 14/34
[52] U.S. Cl. ................................ 204/298; 204/192.12
[58] Field of Search ............ 204/192.12, 298, 298 TS, 204/298 ET, 298 EE

[56] References Cited

U.S. PATENT DOCUMENTS

| | | | |
|---|---|---|---|
| 4,324,631 | 4/1982 | Meckel et al. | 204/298 X |
| 4,414,087 | 11/1983 | Meckel | 204/298 X |
| 4,487,675 | 12/1984 | Meckel | 204/298 X |
| 4,547,279 | 10/1985 | Kiyota et al. | 204/298 |
| 4,564,435 | 1/1986 | Wickersham | 204/298 |
| 4,604,180 | 8/1986 | Hirukawa et al. | 204/298 |
| 4,610,770 | 9/1986 | Saito et al. | 204/298 X |
| 4,610,774 | 9/1986 | Sakata et al. | 204/298 |

Primary Examiner—Nam X. Nguyen
Attorney, Agent, or Firm—David A. Draegert; Larry R. Cassett

[57] ABSTRACT

A magnetron sputter coating device having a target of material to be sputtered and a magnetic means for producing a closed-loop magnetic tunnel capable of confining a glow discharge adjacent a surface of the target is disclosed. A groove is provided in the surface of the target along at least part of the erosion region. The groove affects the sputtering voltage and profile of the sputtering surfaces as it erodes. The dimensions and locations of the groove can be selected to optimize the effects for particular magnetron sputtering devices.

14 Claims, 2 Drawing Sheets

MAGNETRON SPUTTERING TARGETS

BACKGROUND OF THE INVENTION

The invention is in the field of sputtering and, specifically, it relates to a magnetically enhanced sputter coating device.

Sputter coating is a process for coating a substrate by removing material from a target by sputtering and depositing material on a substrate. Sputtering is generally performed by placing a sputtering source and the substrate in a chamber provided with a vacuum pump and gas inlets to maintain a sputtering gas of the appropriate composition and pressure.

A variety of magnetron sputter coating devices are known. Such devices are frequently characterized by the shape of the surface from which material is removed by sputtering. U.S. Pat. No. 4,166,018 to Chapin describes a planar magnetron sputter coating device. U.S. Pat. No. 4,060,470 to Clarke describes a conical magnetron sputtering device. U.S. Pat. No. 4,219,397 to Clarke discloses a cylindrical stepped magnetron device in which the target comprises two concentric but axially offset circular cylinders.

Magnetron sputtering devices are used to deposit a variety of coatings. Frequently, the target material is a metal and the coating is a metal or a reaction product of a metal and a gas such as oxygen or nitrogen. Planar, conical and stepped magnetron sputtering sources are frequently used to deposit thin layers in the manufacture of integrated circuits and other semiconductor products.

The present invention is directed to the solution of several problems inherent in magnetron sputtering devices. First, all such devices have a limited inventory of material which can be sputtered before replacement of the target is required. Second, deposition uniformity must be maintained throughout the life of the target. Third, the deposition rate must be controlled despite variations in the operating voltage and other parameters of the source as the target is eroded.

SUMMARY OF THE INVENTION

The invention relates to a magnetron sputter coating device having a target of material to be sputtered and a magnetic means for producing a field having lines of flux which emerge from and return to the target so as to form a magnetic tunnel Capable of confining a glow discharge adjacent a surface of the target which an erosion region forms. A groove is provided in the surface of the target along at least part of the erosion region. The groove can significantly affect the sputtering voltage and profile of the sputtering surface as it erodes. The dimensions and location of the groove can be selected to optimize the effects for particular magnetron sputtering devices.

DESCRIPTION OF THE PREFERRED EMBODIMENTS

FIG. 1 illustrates three types of magnetron sputter coating devices having a groove according to the present invention. FIGS. 1a, 1c and 1e illustrate cross-sectional views of a planar, conical and cylindrical stepped targets, respectively. Material removed from the target 1 is deposited on a substrate 8 aligned adjacent the target. Arching lines 2 illustrate magnetic flux lines which emerge from and return to the sputtering surface of the target. These magnetic lines form a closed loop tunnel over a region which contains a groove 3.

Figure 1A:
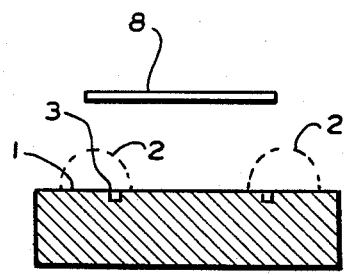
FIG. 1 comprises cross-sectional and plan views of Planar, conical and stepped magnetron targets illustrating the location of typical magnetic field lines and target grooves according to the invention.
Figure 1B:
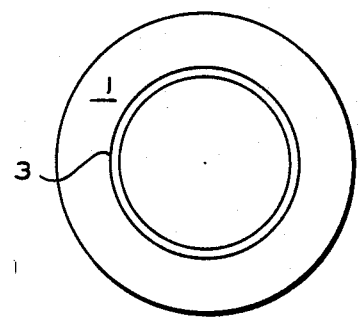
Figure 1C:
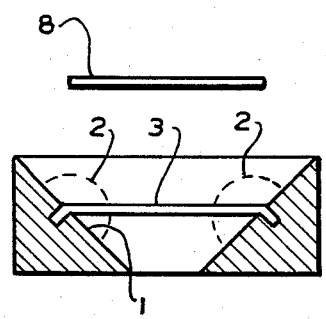

FIG. 1b illustrates a plan view of a planar magnetron sputtering source. Typically, the erosion of a planar magnetron is a maximum in the center of the erosion region and relatively systematic on either side. Preferably the groove 3 is located to the side of the line of maximum erosion but still within the closed-loop erosion region on the surface of the target.

Figure 1D:
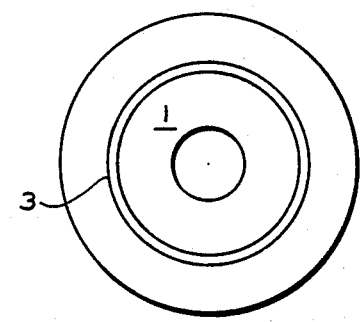
Figure 1E:
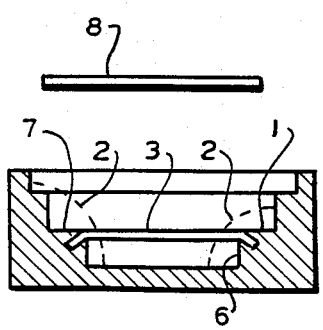

FIG. 1d shows a plan view of a conical magnetron sputtering source showing a groove 3 centered in the erosion region under the magnetic tunnel.

Figure 1F:
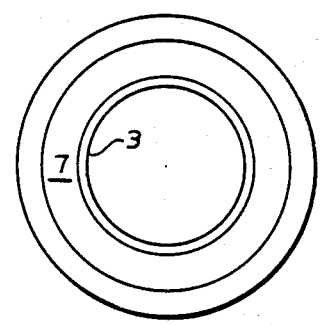

FIG. 1f shows a plan view of a cylindrical stepped magnetron sputtering source showing a circular groove 3 located at the edge where a first riser surface 6 would meet the second level surface 7 of the inner cylinder.

Figure 2A:
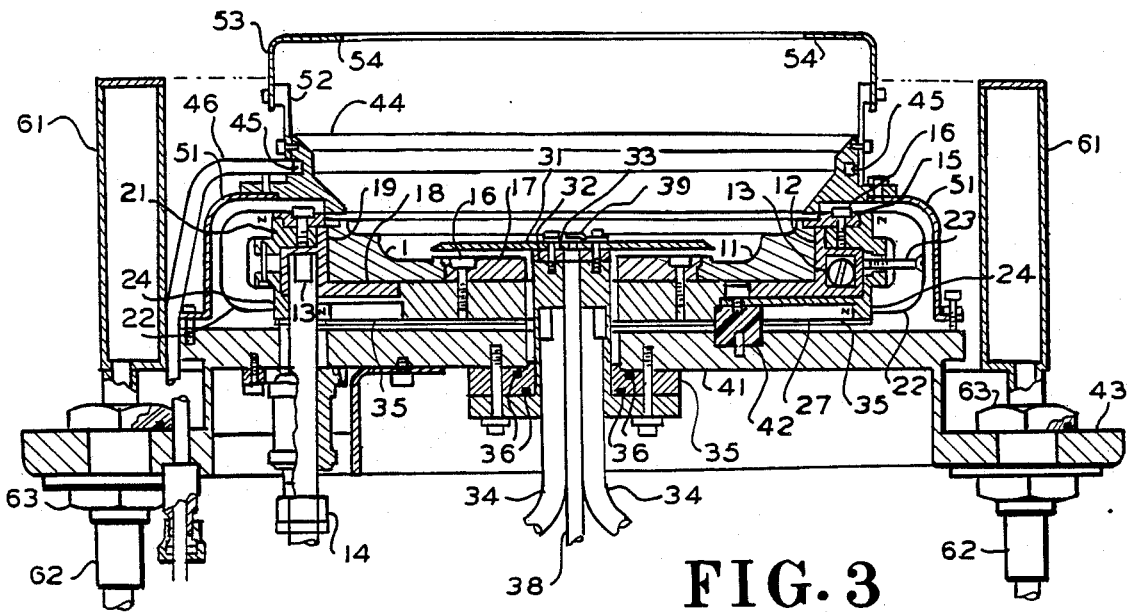
FIG. 2 is a cross-sectional view of a magnetron sputtering device according to the invention.

FIG. 2a is a cross-sectional view of a preferred sputtering source having a circular cylindrical stepped target. The source comprises a target assembly, a magnet assembly, and an annode assembly. The source can be operated in any orientation but it will be described as it appears in FIG. 2a where it is oriented to deposit a coating on a substrate placed above the source.

The target assembly comprises a target 11 preferably fabricated from a single piece of metal or other material to be sputtered. The outer cylindrical surface 19 and the adjoining bottom surface 18 of the target are surrounded by an outer retainer which aids in removing heat from the target. The outer retainer 12 of metal is provided with a circumferential water channel 13 and pipes, such as 14, to allow the circulation of cooling water. The target is held against the outer retainer by a top retainer ring 15 and a number of screws 16.

Figure 2B:
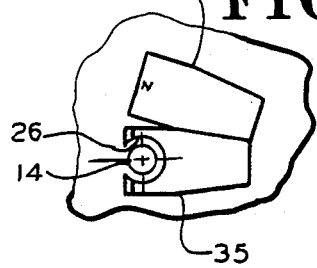

The magnet assembly comprises an upper pole piece 21 and a lower pole piece 24. These pole pieces are connected by a number of U-shaped magnets 22 held in position by screws 23 which engage the outer target retainer 12. In order to increase the magnetic field strength, a number of bar magnets 35 are positioned along radial lines in contact with the lower pole piece. As illustrated in the plan view of FIG. 2b, certain of the bar magnets have a cut-out 26 to provide clearance for the water pipes 14. The bar magnets are provided with a bottom keeper 27. The target 11 and the lower pole piece are held together by an inner target retainer 17 and a number of screws.

The target assembly and the magnet assembly are isolated from a mounting plate 41 by a number of insulators 42 so that the assemblies may be maintained at negative electric potential. The mounting plate may form part of the wall 43 of the vacuum chamber.

The anode assembly comprises an anode disk 31, a block 32 and a spacer 33 which are held together by screws. The block has pipes 34 for circulating cooling water. The anode assembly is aligned in a clearance opening which extends through the inner target retainer 17, the lower pole piece 24 and the mounting plate 41. The anode assembly is fixed to the mounting plate by screws which extend through an electrical insulator 35 which has two grooves for 0-rings 36 to provide a vacuum seal. The anode is provided with a gas pipe 38 extending from outside the chamber and a gas clamp 39, removably attached to the anode disk 31 by a screw.

The sputtering source is also provided with a dark space shield 44 which is aligned adjacent to the retainer ring 15. The shield 44 is provided with a circumferential channel 45 and supply pipes 46 to enable circulation of cooling water.

The shield 44 is supported on the mounting plate by a magnet cover 51. A heat transfer ring 52 extends from the dark space shield 44 to support a front shield 53 having a circular opening 54 to permit sputtered material to move from the sputtering surface to a substrate to be coated.

The sputtering source is also provided with a hollow cylindrical cold trap 61. The cold trap can be supplied with liquid nitrogen by means of pipes 62 and fittings 63 which extend through the chamber wall.

Figure 3:
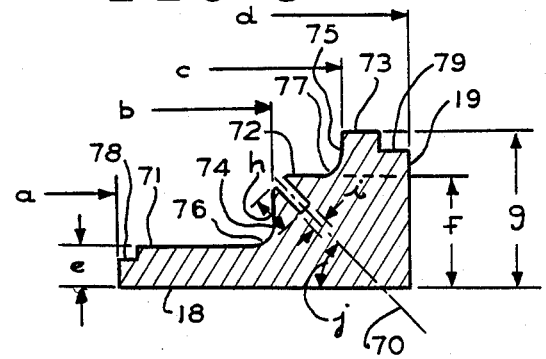
FIG. 3 is a cross-sectional view of part of a sputtering target identifying the various dimensions.

FIG. 3 is a cross section of a cylindrical stepped sputtering target illustrating the dimensions characteristic of the invention.

The sputtering target comprises a first level 71, a second level 72 and a top level 73 which are generally horizontal in the figure. The first and second levels are connected by a first riser 74 and the second and top levels are connected by a second riser 75. The first level and the first riser may meet in an angle of approximately 90°, however, in the preferred embodiment they are connected by a curve 76 having a radius of approximately 0.25 inches. Such a curve provides additional material in the erosion region. Similarly, the second level and the second riser are preferably connected by a second curve 77 of similar radius. The inner edge of the first level and the outer edge of the top level may have cutouts 78 and 79 to accommodate the inner and outer retainers 17 and 15, respectively. As indicated in FIG. 3, the diameters of the inner cylindrical surface, the first riser, the second riser, and the outer cylindrical surface 19 are identified by the letters a, b, c, and d, respectively. Similarly, the thickness of the target from the bottom surface to the first level, the second level, and the top level, are indicated by the letters e, f and g, respectively.

In FIG. 3, the groove according to the invention has a depth h which extends along a line 70 which makes an angle j with respect to the bottom surface 18 of the target. Preferably, the groove initially has parallel walls separated by a width i, but the width may increase and parallelism decrease as the target erodes. Grooves having a width greater than about 0.025 inches and a depth up to about 0.125 inches can be made in aluminum and many other metals and alloys by conventional machining methods.

FIG. 4 illustrates the change in the profile of an aluminum sputtering targets as their surface is eroded. The initial sputtering surface 81 is similar to the surface 71,74, 72, 75 shown in FIG. 3. An extended period of sputtering errodes the target material shown between the initial surface 1 and the final sputtering surface 82. The dimensions of the three sputtering targets of FIGS. 4a, 4b and 4c are given in Table 1. The dimensions of the target of FIG. 4d are similar except for the different dimensions indicated in Table 2.

Each of the sputtering targets was mounted in a sputter coating device similar to that shown in FIG. 2. The substrate and the sputtering device were placed in a chamber which was continuously evacuated and provided with argon gas to maintain a pressure of 3 millitorr.

TABLE 1

| Target Dimensions (inches) | | | | | | | | |
|---|---|---|---|---|---|---|---|---|
| a | b | c | d | e | f | g | h | j |
| 4.12 | 6.30 | 7.15 | 8.00 | 0.32 | 0.75 | 1.00 | 0.25 | 52° |

TABLE 2

| Target Dimensions (inches) | | | | |
|---|---|---|---|---|
| a | b | c | e | f |
| 4.55 | 6.05 | 6.90 | 0.37 | 0.80 |

TABLE 3

| | SUMMARY OF TARGET PERFORMANCE | | | | | | | | |
|---|---|---|---|---|---|---|---|---|---|
| FIG. | SLOT WIDTH (IN.) | INITIAL WEIGHT (GMS.) | FINAL WEIGHT (GMS.) | WEIGHT LOSS (GMS.) | PERCENT UTILIZED (%) | DEPOSIT THICKNESS MICRONS | TARGET LIFETIME (kWh) | INITIAL VOLTAGE (V) | FINAL VOLTAGE (V) |
| 4a | 0 | 965 | 740 | 225 | 23 | 1240 | 249 | 563 | 425 |
| 4b | 0.05 | 960 | 678 | 282 | 29 | 1816 | 329 | 588 | 465 |
| 4c | 0.08 | 962 | 640 | 322 | 33 | 1788 | 420 | 455 | 458 |
| 4d | 0.05 | 1011.5 | 680 | 331 | 33 | 2168 | 504 | 680 | 425 |

The sputtering device was connected to a dc power supply and sputtered until the erosion profile was within approximately 0.1 inches of either the outer cylindrical surface 19 or the bottom surface 18 of the target. The sputtered material was collected on planar substrates placed adjacent the opening in the front cover of the sputter coating device.

The initial and final weights of the target, the initial and final sputtering voltages, the target lifetime and the thickness of material collected on the substrate for the four cathodes of FIG. 4 are given in Table 3. The weight loss and the percentage weight loss are also given in Table 3.

Figure 4A:
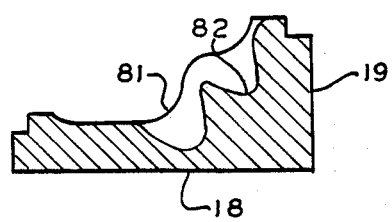
FIG. 4 illustrates the before and after profiles of several sputtering targets with and without grooves according to the invention.
Figure 4B:
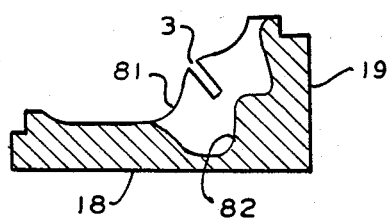
Figure 4C:
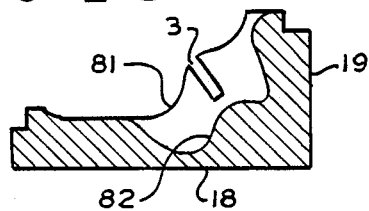
Figure 4D:
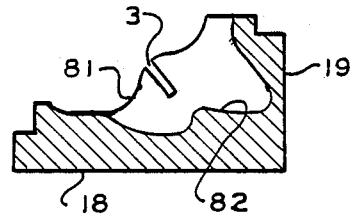

FIG. 4a and Table 3 indicate that a stepped sputtering target having no groove was eroded to the limit in 249 kilowatt hours. The final sputtering surface 82 is closer to the bottom surface 18 than the outer cylindrical surface 19. Note the lack of erosion of the region adjacent the intersection of the first riser and the second level of the sputtering target. The resulting target protrusion results in distortions in the thickness distribution of sputtered material deposited on the substrate. FIG. 4b illustrates the erosion of a sputtering target similar to that of 4a but which is provided with a groove of thickness 0.05 inches according to the invention. After sputtering for 329 kilowatt hours the erosion curve 82 is still closer to the bottom surface of the target, but the size of the protrusion is greatly reduced. FIG. 4c illustrates the erosion of a target similar to FIG. 4b but having a groove of width 0.08 inches. Note that the shape of the erosion region after 420 kilowatt hours is quite similar to that of FIG. 4b. FIG. 4d illustrates the erosion of a modified sputtering target which has greater thicknesses e and f and a smaller diameter c, all of which tend to increase the amount of material which can be eroded. The eroded surface 82 is closer to the outer cylindrical surface 19 than to the bottom surface 18. The lifetime of the target was 504 kilowatt hours the thickness of the deposited material was 2168 micrometers, which is 75% greater than thickness for the target of FIG. 4a having no groove. Such an improvement can significantly reduce costs by reducing the frequency of target replacements.

The use of a groove in the erosion region of a magnetron sputtering source has two primary effects. First, a groove can significantly effect the profile of the erosion region as the target erodes. As can be seen from FIG. 4 and Table 3, this effect can be of particular benefit in the operation of a cylindrical stepped magnetron device. Second, under certain circumstances, the use of a groove can significantly lower the sputtering voltage for a magnetron. This can be seen by comparing the voltages for the target of FIG. 4c with those for the other targets of FIG. 4. This voltage lowering effect can be of benefit in any magnetron.

The selection of the width, depth and location of the groove depend upon the effects desired. The major factors to be considered are as follows.

In a stepped cylindrical magnetron the target material is primarily eroded from two areas on the top and on the riser of a cylindrical step. Two rings of glowing plasma may be formed. The distribution of material which is deposited on a substrate is an overlapping combination of sputtered material from the two areas. The spacing between the target and the substrate can be chosen to optimize the thickness uniformity of the coating. Unfortunately, the coating thickness distribution may change as the target is eroded because of distortions and even shadowing caused by uneven erosion from the target surface.

The distortion of the profile of a stepped target can be significantly reduced by a groove in the erosion region. The width, depth and location of the groove are chosen to maintain the desired target profile throughout its sputtering lifetime. Removal of excess material may result in structural weakening and premature failure of the target. The angle j for the targets of FIG. 4b, 4c and 4d was 52°. This angle served to divide the material on either side of the groove into approximately equal volumes. An angle in the range of 40° to 60° is preferred depending upon the shape of the erosion surface to be maintained. The groove extends along the magnetic tunnel throughout the portion of the erosion region from which substantial amounts of material are deposited on the substrate. Such a groove is long enough not to disturb the coating thickness distribution. Continuous, closed loop circumferential grooves are preferred in cylindrical stepped magnetron devices.

The effect of a groove on the operating potential depends upon the width of the groove. The gas breakdown and the operating voltage of a sputtering system depend upon the mean-free-path of secondary electrons. Paschen's law relates the breakdown voltage to the product of the gas pressure and electrode separation in a simple diode system. Magnetic fields and sharp edges effect the breakdown of the gas but in a magnetron sputtering system there is a pressure below which the glow will not light and sputter coating is impractical. After breakdown, the sputtering voltage decreases as the pressure increase. Similarly, for a given pressure, no glow can exist in a space having dimensions less than a distance called the dark space dimension. Grooves having a width less than the dark space dimension have little effect upon the breakdown and operating voltages of a magnetron sputtering source. The limited effect on the sputtering voltage can be seen by comparison of the voltages for the targets of 4a (with no groove) and 4b for which the width of the groove (0.05 inches) is less than the dark space dimension. The dark-space dimension is typically 0.06 inches for a magnetron sputter coating device at a pressure of 3 millitorr. In contrast, the groove of the target of FIG. 4c has a width of 0.08 inches and the sputtering voltage is significantly lower, as indicated in Table 3.

The breakdown and the sputtering potentials for magnetron sputtering source also depend upon the magnetic field strength. Since the magnetic pole pieces are usually on the opposite side of the target from the sputtering surface, use of a thicker target shifts the glow discharge to a region of lower magnetic field strength and increases the breakdown and sputtering voltages. The use of sputtering potential greater than about 800 volts is avoided in the coating of semiconductor substrates in order to minimize damage to the substrates.

A groove having a width greater than the dark-space dimension can significantly lower the breakdown and sputtering potentials. Such a groove enables the use of a thicker target having a longer lifetime. The groove should be located in a portion of the erosion region where it will not adversely effect the lifetime or the deposition pattern. Since the sputtering voltage normally tends to decrease as the target erodes, the depth of the groove need be no greater than necessary to lower the initial sputtering voltage below the desired level. In certain situations, the distribution of material on a substrate is not affected by material from all parts of the erosion region. This is the case, for example, in a rectangular planar magnetron which is sufficiently long that the coating from the ends of the erosion region can be ignored. In these situations, it is possible that the groove need not be continuous through the end regions, but it should extend along the sides of the erosion region so as to not disturb the uniformity of the coating.

A shallow, wide groove and a narrow, deep groove may be used together to lower the initial sputtering voltage, and control the erosion profile throughout the lifetime of a sputtering target. A single groove which is wider at the top than at the bottom may have similar effects.

What is claimed is:

1. A magnetron sputter coating device, comprising:
   a target comprising material to be sputtered and having two adjacent surfaces which would meet at an edge;
   a magnetic means for producing a field having lines of flux which emerge from and return to the target so as to form a magnetic tunnel capable of confining a glow discharge adjacent a region including portions of the two surfaces, which region is eroded in operation;
   a groove in the erosion region located where the two surfaces would meet and extending along the magnetic tunnel throughtout the portion of the erosion region from which substantial amounts of material are deposited on a substrate.

2. A magnetron device according to claim 1, wherein the groove has sidewalls that are substantially parallel and a depth of greater than the dark-space dimension in intended operation such that the sputtering potential of the device is lowered and remains substantially constant as the target is sputtered.

3. A magnetron device according to claim 1, wherein the groove has a width of greater than 0.025 inches and less than 0.125 inches.

4. The magnetron device according to claim 3, wherein the width of the groove is less than the dark-space dimension in intended operation such that sputtering potential of the device is not substantially affected.

5. The magnetron device according to claim 3, wherein the side walls of the groove are substantially parallel and the width of the groove is greater than the dark-space dimension in intended operation such that sputtering potential of the device is lowered and remains substantially constant as the target is sputtered.

6. The magnetron device according to claim 1, wherein the groove is continuous loop.

7. The magnetron device according to claim 6, wherein the two surfaces comprise a side and top surface of a cylindrical step.

8. A magnetron device according to claim 1, wherein the groove has a width of greater than 0.025 inches and less than 0.125 inches.

9. The magnetron device according to claim 7, wherein the width of the of the groove is less than the dark-space dimension in intended operation such that sputtering potential is not substantially affected.

10. The magnetron device according to claim 7, wherein the groove has sidewalls that are substantially parallel and the width of the groove is greater than the dark-space dimension in intended operation such that the sputtering potential of the device is lowered and remains substantially constant as the target is sputtered.

11. The magnetron device according to claim 7, wherein the depth of the groove extends along a line which make an angle in the range 40° to 60° with respect to the top surface.

12. A magnetron device according device according to claim 11, wherein the groove has width of greater than 0.025 inches and less than 0.125 inches.

13. The magnetron device according the claim 12, wherein the width of the of the groove is less than the dark-space dimension in intended operation such that sputtering potential is not substantially affected.

14. The magnetron device according to claim 12, wherein the groove has sidewalls that are substantially parallel and the width of the groove is greater than the dark-space dimension in intended operation such that the sputtering potential of the device is lowered and substantially constant as the target is sputtered.

* * * * *

UNITED STATES PATENT AND TRADEMARK OFFICE
CERTIFICATE OF CORRECTION

PATENT NO. : 4,834,860

DATED : May 30, 1989

INVENTOR(S) : Richard E. Demaray et al

It is certified that error appears in the above-identified patent and that said Letters Patent is hereby corrected as shown below:

Title page, abstract, line 8, "surfaces" should read --surface-- .

Column 1, line 49, "Capable" should read --capable--.

Column 1, line 61, "Planar" should read --planar--.

Column 6, line 68, "throughtout" should read --throughout--.

Column 7, line 27, "is continous loop" should read --is a continous loop--.

Column 8, line 1, "according to claim 1" should read --according to claim 7--.

Column 8, line 21, the second "the" should read --to--.

Signed and Sealed this

Twenty-fourth Day of April, 1990

Attest:

HARRY F. MANBECK, JR.

*Attesting Officer*   *Commissioner of Patents and Trademarks*